(12) United States Patent
Seol et al.

(10) Patent No.: US 9,264,039 B2
(45) Date of Patent: Feb. 16, 2016

(54) CIRCUIT AND METHOD FOR ON-DIE TERMINATION, AND SEMICONDUCTOR MEMORY DEVICE INCLUDING THE SAME

(71) Applicant: SAMSUNG ELECTRONICS CO., LTD., Suwon-si, Gyeonggi-do (KR)

(72) Inventors: Ho-Seok Seol, Daegu (KR); Seung-Jun Bae, Hwaseong-si (KR); Young-Soo Sohn, Seoul (KR); Ho-Sung Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 152 days.

(21) Appl. No.: 14/202,323

(22) Filed: Mar. 10, 2014

(65) Prior Publication Data

US 2014/0266299 A1 Sep. 18, 2014

(30) Foreign Application Priority Data

Mar. 13, 2013 (KR) ........................ 10-2013-0026947

(51) Int. Cl.
*H03K 17/16* (2006.01)
*H03K 19/003* (2006.01)
*H03K 19/00* (2006.01)

(52) U.S. Cl.
CPC ................................ *H03K 19/0005* (2013.01)

(58) Field of Classification Search
USPC ....................................................... 326/21, 30
See application file for complete search history.

(56) References Cited

U.S. PATENT DOCUMENTS

| | | | |
|---|---|---|---|
| 7,692,446 B2 | 4/2010 | Lee et al. | |
| 7,710,143 B2 | 5/2010 | Jeong et al. | |
| 7,773,440 B2 | 8/2010 | Kim et al. | |
| 7,884,637 B2 | 2/2011 | Jeong | |
| 7,969,182 B2 | 6/2011 | Kim | |
| 2006/0226868 A1* | 10/2006 | Lee | H03K 19/0005 326/30 |
| 2007/0010961 A1* | 1/2007 | Nguyen | H03F 3/19 702/107 |
| 2010/0315119 A1* | 12/2010 | Welker | H03K 5/1565 326/30 |
| 2011/0216612 A1* | 9/2011 | Ishikawa | G11C 11/406 365/194 |
| 2012/0256655 A1* | 10/2012 | Kim | H03K 19/018557 326/30 |
| 2013/0007333 A1* | 1/2013 | Fai | G06F 13/4086 710/313 |
| 2013/0117599 A1* | 5/2013 | Mochida | G11C 11/4076 713/503 |
| 2013/0162288 A1* | 6/2013 | Song | H03K 19/018557 326/30 |
| 2014/0002130 A1* | 1/2014 | Jang | H03K 17/16 326/30 |
| 2014/0075135 A1* | 3/2014 | Choi | G06F 12/00 711/155 |
| 2014/0266299 A1* | 9/2014 | Seol | H03K 19/0005 326/30 |
| 2015/0115999 A1* | 4/2015 | Lee | H03K 19/017545 326/30 |

* cited by examiner

*Primary Examiner* — Adam Houston
(74) *Attorney, Agent, or Firm* — Lee & Morse, P.C.

(57) ABSTRACT

An on-die termination (ODT) circuit includes a calibration unit, an offset-code generating unit, an adder, and an ODT unit. The calibration unit generates a pull-up code and a pull-down code. The offset-code generates a pull-up offset code and a pull-down offset code based on a mode-register-set signal, the pull-up code, and the pull-down code. The adder adds the pull-up offset code and the pull-down offset code to the pull-up code and the pull-down code, respectively, and generates a pull-up calibration code and a pull-down calibration code. The ODT unit changes ODT resistance in response to the pull-up calibration code and the pull-down calibration code.

20 Claims, 12 Drawing Sheets

CIRCUIT AND METHOD FOR ON-DIE TERMINATION, AND SEMICONDUCTOR MEMORY DEVICE INCLUDING THE SAME

CROSS-REFERENCE TO RELATED APPLICATION

Korean Patent Application No. 10-2013-0026947, filed on Mar. 13, 2013, and entitled, "Circuit and Method For On-Die Termination, and Semiconductor Memory Device Including the Same," is incorporated by reference herein in its entirety.

BACKGROUND

1. Field

One or more embodiments described herein relate to semiconductor devices.

2. Description of Related Art

Semiconductor memory devices exchange data and control signals with a memory controller through buses. Generally, the higher the frequency of a signal transmitted between the memory controller and a semiconductor memory devices, the more likely the signal may become distorted. Techniques have been proposed for addressing this issue. For example, one method involves using a termination resistor to absorb reflection of the signal. This may reduce or prevent distortion.

SUMMARY

In accordance with one embodiment, an on-die termination (ODT) circuit includes a calibration unit configured to generate a pull-up code and a pull-down code; an offset-code generating unit configured to generate a pull-up offset code and a pull-down offset code based on a mode-register-set signal, the pull-up code, and the pull-down code; an adder configured to add the pull-up offset code and the pull-down offset code to the pull-up code and the pull-down code, respectively, and configured to generate a pull-up calibration code and a pull-down calibration code; and an ODT unit configured to change ODT resistance in response to the pull-up calibration code and the pull-down calibration code. The pull-up offset code and the pull-down offset code may be configured to vary according to a result of impedance (ZQ) calibration.

The pull-up offset code and the pull-down offset code may be configured to vary according to a variation of one or more of a fabrication process, operating voltage, or temperature.

The ODT circuit may be configured to compensate for impedance of a data bus in a memory system. The ODT circuit may be configured to compensate for an impedance of a command/address bus in a memory system.

The offset-code generating unit may include a divider configured to divide the pull-up code and the pull-down code by a predetermined division ratio and to generate a divided pull-up code and a divided pull-down code; and a selecting circuit configured to select the MRS signal, the divided pull-up code, and/or the divided pull-down code to output the pull-up offset code and the pull-down offset code.

The calibration unit may include a first pull-up resistor unit coupled to an impedance (ZQ) pad, and configured to be turned on in response to the pull-up code; a second pull-up resistor unit coupled to a first node, and configured to be turned on in response to the pull-up code; a pull-down resistor unit coupled to the first node, and configured to be turned on in response to the pull-down code; a first comparator configured to compare a reference voltage and a voltage of the ZQ pad; a second comparator configured to compare the reference voltage and a voltage of the first node; a pull-up counter configured to generate the pull-up code based on an output signal of the first comparator; and a pull-down counter configured to generate the pull-down code based on an output signal of the second comparator.

The ODT unit may include a pull-up resistor unit coupled to an output pad, and configured to operate in response to the pull-up calibration code; and a pull-down resistor unit coupled to the output pad, and configured to operate in response to the pull-down calibration code.

In accordance with another embodiment, a semiconductor device includes an output pad; and the ODT circuit in accordance with the aforementioned embodiment, the ODT circuit coupled to the output pad and configured to adjust an output impedance. The ODT circuit is configured to change at least one of the pull-up offset code or the pull-down offset code according to a result of impedance (ZQ) calibration. The pull-up offset code and the pull-down offset code is configured to adaptively vary according to variations of a fabrication process, operating voltage, and/or a temperature. The semiconductor device may be a stacked memory device, and chips in the stacked memory device may be coupled through-silicon-via (TSV), the chips communicating at least one of data or control signals.

In accordance with another embodiment, a method of on-die termination (ODT) includes generating a pull-up code and a pull-down code; generating a pull-up offset code and a pull-down offset code based on a mode-register-set signal, the pull-up code, and the pull-down code; adding the pull-up offset code and the pull-down offset code to the pull-up code and the pull-down code, respectively, to generate a pull-up calibration code and a pull-down calibration code; and changing an ODT resistance in response to the pull-up calibration code and the pull-down calibration code.

Generating the pull-up offset code and the pull-down offset code may include dividing the pull-up code and the pull-down code by a predetermined division ratio, to generate a divided pull-up code and a divided pull-down code; and selecting the MRS signal, or the divided pull-up code and the divided pull-down code to output as the pull-up offset code and the pull-down offset code. The pull-up offset code and the pull-down offset code may be configured to vary according to a result of impedance (ZQ) calibration.

In accordance with another embodiment, a control device includes an impedance calibration unit to generate at least a first code; an adder to add a second code to the first code to form a third code; and an on-die termination unit to adjust a resistance of a pad based on the third code. The second code may be generated based on the first code and a mode register set signal. The on-die termination unit may adjust the resistance of the pad to substantially match a resistance of a circuit coupled to the pad.

The third code may include N bits, where N>1, the N bits control a respective number of switches, the switches are coupled to a respective number of resistors, and the on-die termination unit adjusts the resistance of the pad based on a combination of resistors coupled to the switches having on-states controlled by ones of the N bits in the third code having a predetermined logical value. The second code may be an offset code.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
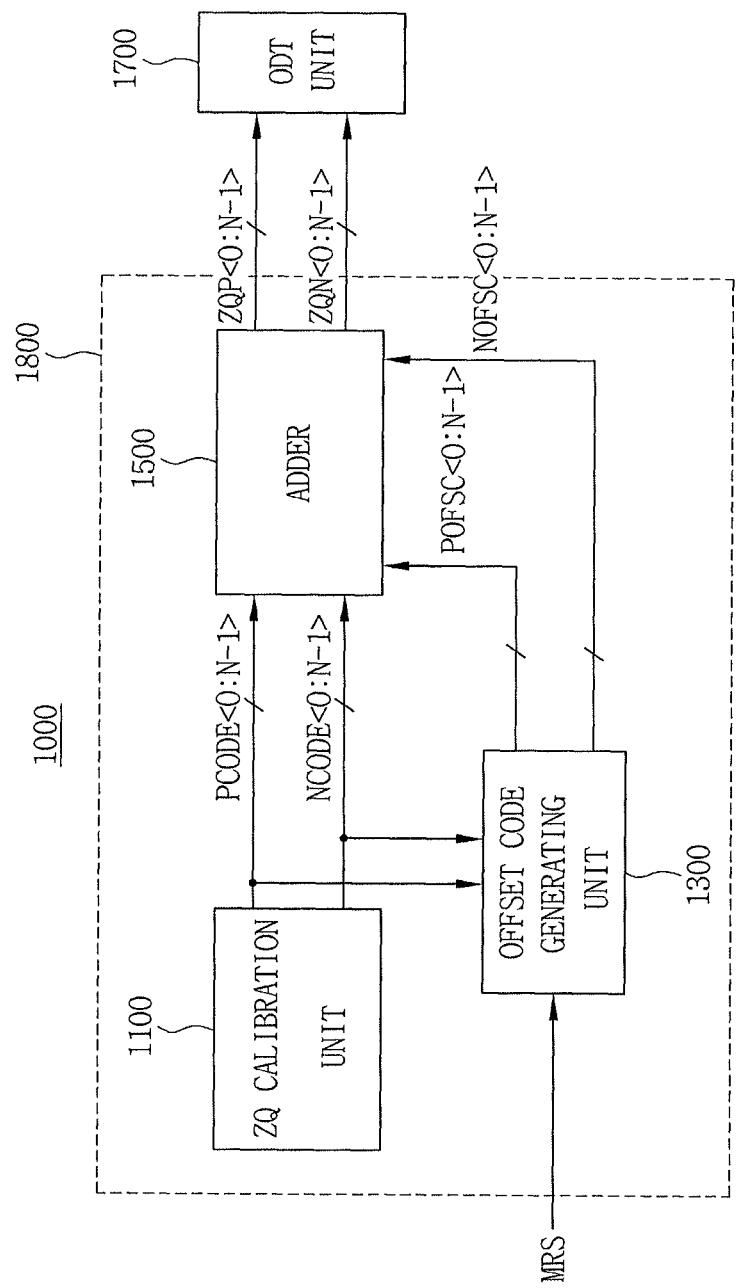
FIG. 1 illustrates an embodiment of an ODT circuit.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

FIG. 1 illustrates an embodiment of an on-die termination (ODT) circuit 1000 which includes an impedance (ZQ) calibration circuit 1800 and an ODT unit 1700. The ZQ calibration circuit 1800 may include a ZQ calibration unit 1100, an offset-code generating unit 1300, and an adder 1500.

The ZQ calibration unit 1100 generates a pull-up code PCODE<0:N−1> and a pull-down code NCODE<0:N−1>. The offset-code generating unit 1300 generates a pull-up offset code POFSC<0:N−1> and a pull-down offset code NOFSC<0:N−1> based on a mode-register-set signal MRS, the pull-up code PCODE<0:N−1>, and the pull-down code NCODE<0:N−1>. The adder 1500 adds the pull-up offset code POFSC<0:N−1> and the pull-down offset code NOFSC<0:N−1> to the pull-up code PCODE<0:N−1> and the pull-down code NCODE<0:N−1>, respectively, and generates a pull-up calibration code ZQP<0:N−1> and a pull-down calibration code ZQN<0:N−1>. The ODT unit 1700 changes ODT resistance in response to the pull-up calibration code ZQP<0:N−1> and the pull-down calibration code ZQN<0:N−1>.

The pull-up offset code POFSC<0:N−1> and the pull-down offset code NOFSC<0:N−1> may vary according to a result of ZQ calibration. Therefore, the pull-down offset code NOFSC<0:N−1> may vary, for example, according to variations of a fabrication process, an operating voltage, and a temperature.

Figure 2:
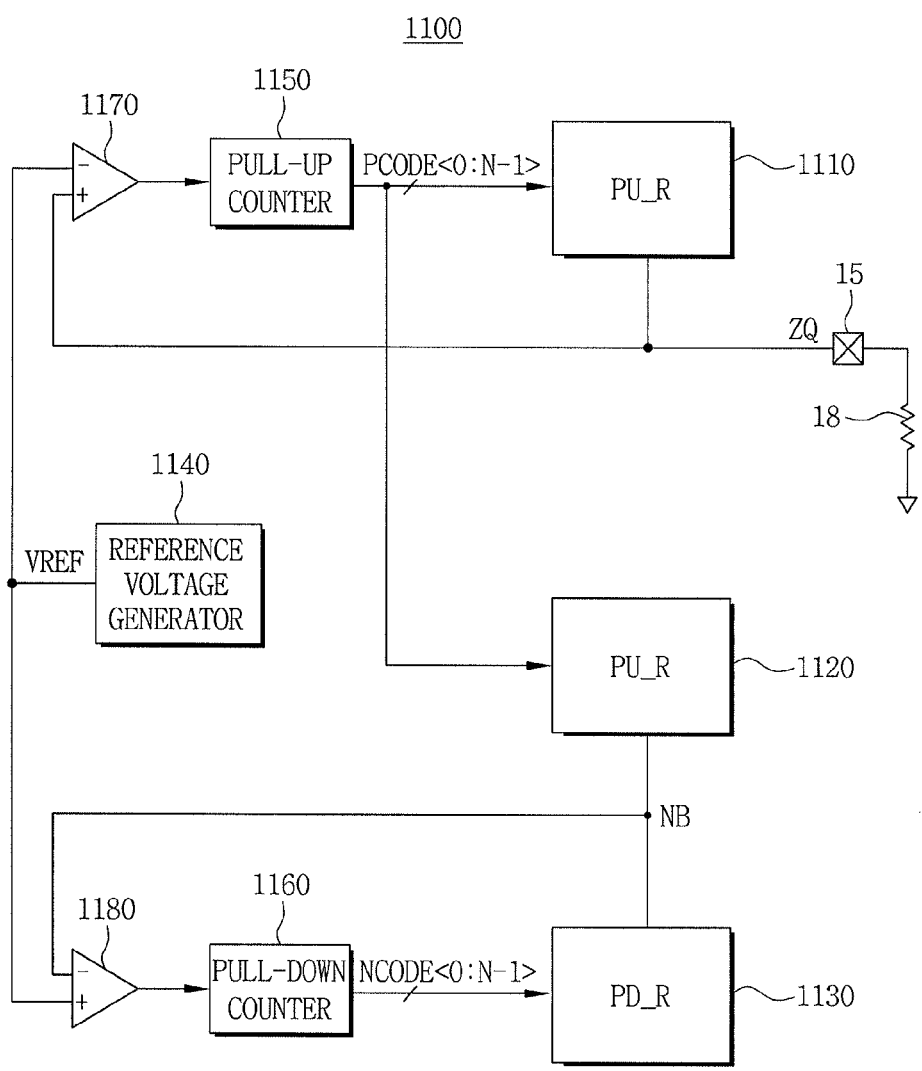
FIG. 2 illustrates an embodiment of a ZQ calibration unit in the ODT circuit.

FIG. 2 illustrates an embodiment of the ZQ calibration unit 1100 in the ODT circuit of FIG. 1. Referring to FIG. 2, the ZQ calibration unit 1100 includes a ZQ pad 15, a first pull-up resistor unit 1110, a second pull-up resistor unit 1120, a pull-down resistor unit 1130, a reference voltage generator 1140, a pull-up counter 1150, a pull-down counter 1160, a first comparator 1170, and a second comparator 1180. A resistor 18, which may be located outside a semiconductor memory device that includes the ODT circuit 1000, may be connected to the ZQ pad 15.

The first pull-up resistor unit 1110 is coupled to the ZQ pad 15 and may include one or more PMOS transistors, NMOS transistors, and/or resistors. The first pull-up resistor unit 1110 may be turned on in response to the pull-up code; PCODE<0:N−1>. The pull-down resistor unit 1130 may include one or more PMOS transistors, NMOS transistors, or resistors. The pull-down resistor unit 1130 may be turned on in response to the pull-down code NCODE<0:N−1>. The second pull-up resistor unit 1120 may have the same circuit structure as the first pull-up resistor unit 1110 and may be electrically coupled to the pull-down resistor unit 1130. The first pull-up resistor unit 1110 may be electrically coupled to the external resistor 18.

The reference voltage generator 1140 generates a reference voltage VREF. The first comparator 1170 compares the reference voltage VREF and a voltage of the ZQ pad. The second comparator 1180 compares the reference voltage VREF with a voltage of a node NB to which the second pull-up resistor unit 1120 and the pull-down resistor unit 1130 are connected. The pull-up counter 1150 generates the pull-up code PCODE<0:N−1> based on an output signal of the first comparator 1170. The pull-down counter 1160 generates the pull-down code NCODE<0:N−1> based on an output signal of the second comparator 1180.

The ZQ calibration unit 1100 repeatedly performs comparing operations using the first comparator 1170 and the second comparator 1180, and adjusts resistance of the first pull-up resistor unit 1110, the pull-down resistor unit 1130, and the second pull-up resistor unit 1120 based on the comparing operations. By this compensation process, the resistance of the first pull-up resistor unit 1110 becomes the same or substantially the same as the resistance of the external resistor 18. For example, the resistance of the external resistor 18 may be 240 ohms.

Figure 3:
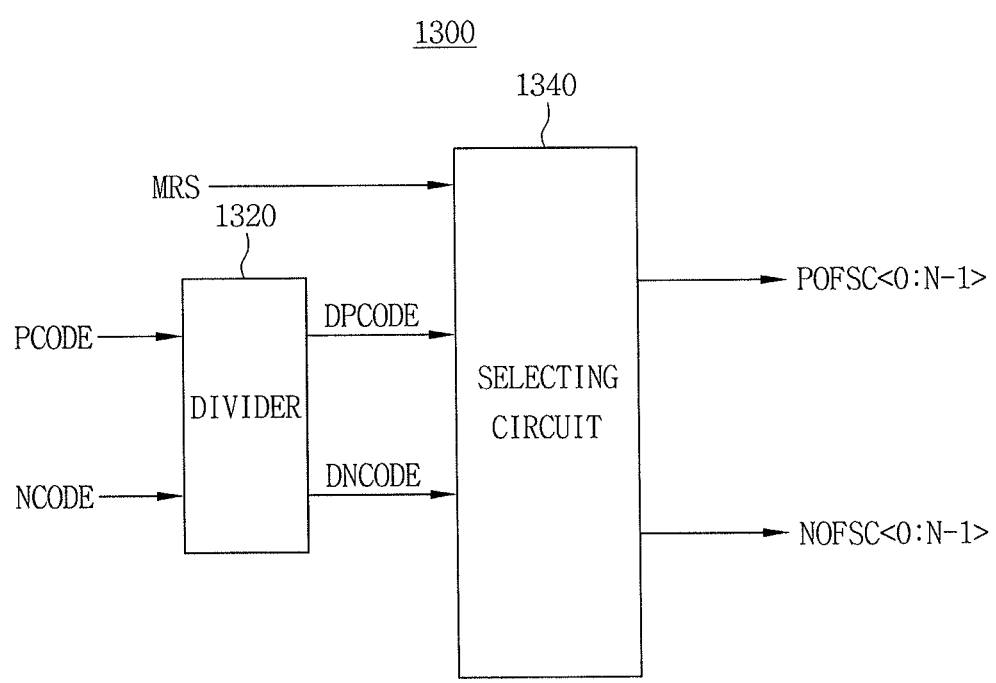
FIG. 3 illustrates an embodiment of an offset-code generating unit in the ODT circuit.

FIG. 3 illustrates an embodiment of an offset-code generating unit 1300 in the ODT circuit 1000 of FIG. 1. Referring to FIG. 3, the offset-code generating unit 1300 may include a divider 1320 and a selecting circuit 1340.

The divider 1320 divides the pull-up code PCODE and the pull-down code NCODE by a predetermined division ratio or factor and generates a divided pull-up code DPCODE and a divided pull-down code DNCODE. The selecting circuit 1340 selects for output the mode-register-set signal MRS, or the divided pull-up code DPCODE and the divided pull-down code DNCODE as the pull-up offset code POFSC<0:N−1> and the pull-down offset code NOFSC<0:N−1>, respectively. For example, a division ratio may be set as 8 to change an output impedance to one eighth times. Further, the division ratio may be set as 16 to change the output impedance to one sixteenth times.

In accordance with one embodiment, the ODT circuit 1000 changes the offset codes for ZQ calibration according to the result of the ZQ calibration. Therefore, the offset codes of the ODT circuit 1000 may not be fixed, but may vary according to, for example, variations of a fabrication process, an operating voltage, and/or a temperature.

Figure 4:
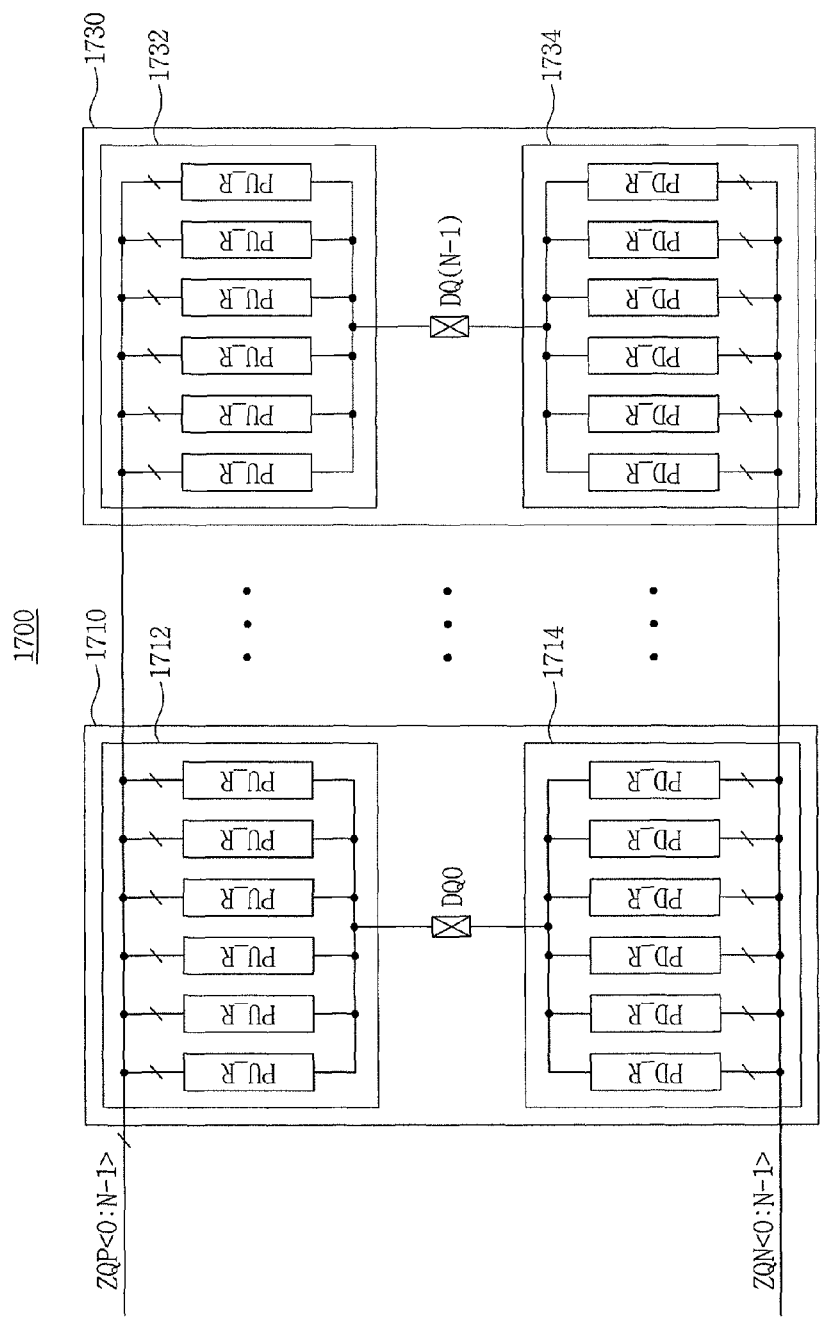
FIG. 4 illustrates an embodiment of an ODT unit in the ODT circuit.

FIG. 4 illustrates an embodiment of an ODT unit 1700 in the ODT circuit 1000 of FIG. 1. Referring to FIG. 4, the ODT unit 1700 may include the first to Nth ODT units 1710 to 1730. The first ODT unit 1710 may include a pull-up resistor unit 1712 and a pull-down resistor unit 1714 commonly connected to an output pad DQ0. The pull-up calibration code ZQP<0:N−1> is applied to the pull-up resistor unit 1712, and the pull-down calibration code ZQN<0:N−1> is applied to the pull-down resistor unit 1714. The pull-up resistor unit 1712 may include a plurality of pull-up resistors PU_R, and the pull-down resistor unit 1714 may include a plurality of pull-down resistors PD_R. The Nth ODT unit 1730 may include a pull-up resistor unit 1732 and a pull-down resistor unit 1734 commonly connected to an output pad DQ(N−1). The pull-up calibration code ZQP<0:N−1> is applied to the pull-up resistor unit 1732, and the pull-down calibration code ZQN<0:N−1> is applied to the pull-down resistor unit 1734.

Figure 5:
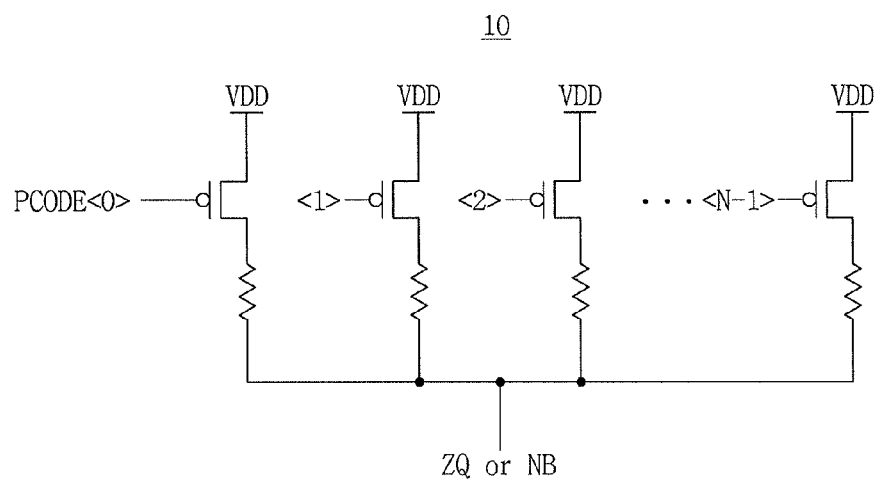
FIG. 5 illustrates an embodiment of a pull-up resistor unit in the ZQ calibration unit.

FIG. 5 illustrates an embodiment of a pull-up resistor unit in the ZQ calibration unit of FIG. 2. Referring to FIG. 5, the pull-up resistor unit 10 may include a plurality of resistors and PMOS transistors serially connected to each other and connected to the ZQ pad or the node NB. The bits of the pull-up code PCODE<0:N−1> may be applied to respective ones of the PMOS transistors.

Figure 6:
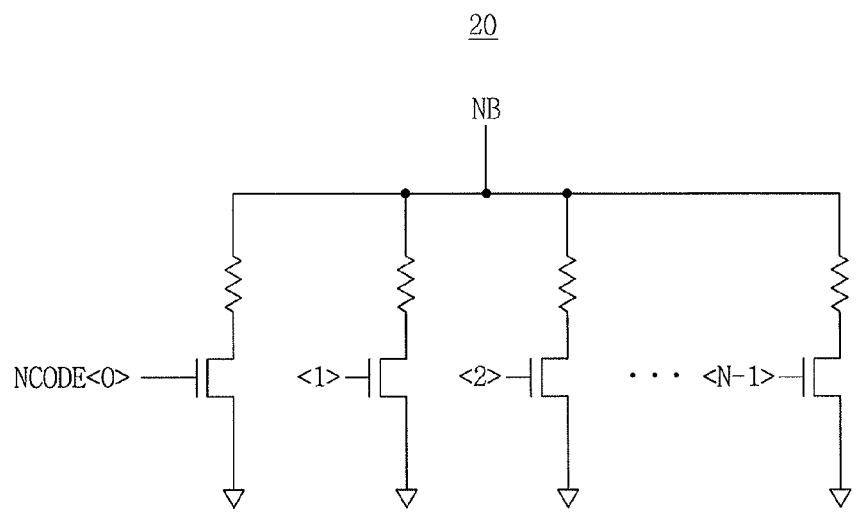
FIG. 6 illustrates an embodiment of a pull-down resistor unit in the ZQ calibration unit.

FIG. 6 illustrates an embodiment of a pull-down resistor unit in the ZQ calibration unit of FIG. 2. Referring to FIG. 6, the pull-down resistor unit 20 may include a plurality of resistors and NMOS transistors serially connected to each other and connected to the node NB. The bits of the pull-down code NCODE<0:N−1> may be applied to respective ones of the NMOS transistors.

Figure 7:
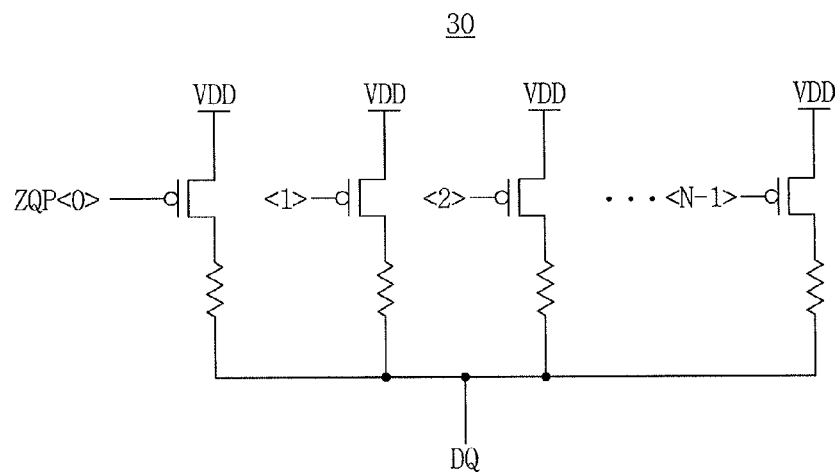
FIG. 7 illustrates an embodiment of a pull-up resistor unit in the ODT unit.

FIG. 7 illustrates an embodiment of a pull-up resistor unit in the ODT unit of FIG. 4. Referring to FIG. 7, the pull-up resistor unit 30 may include a plurality of resistors and PMOS transistors serially connected to each other and connected to an output pad DQ. The bits of the pull-up calibration code ZQP<0:N−1> may be applied to respective ones of the PMOS transistors.

Figure 8:
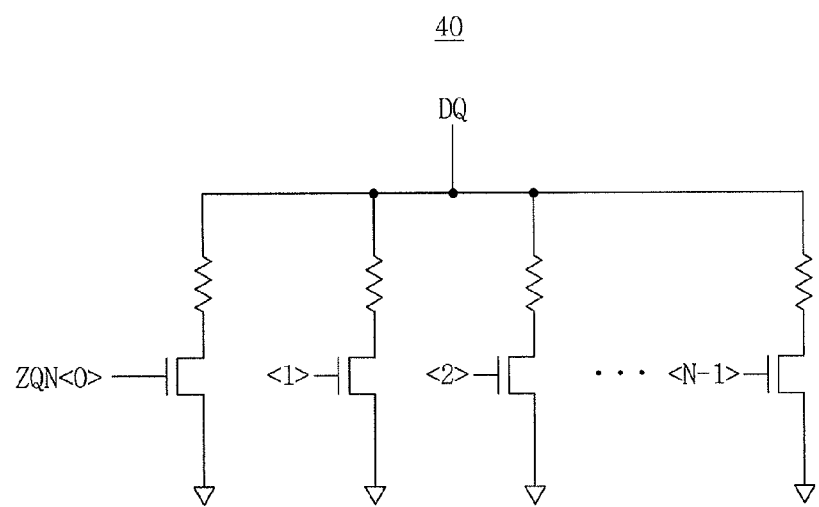
FIG. 8 illustrates an embodiment of a pull-down resistor unit in the ODT unit.

FIG. 8 illustrates a circuit diagram illustrating an embodiment of a pull-down resistor unit included in the ODT unit of FIG. 4. Referring to FIG. 8, the pull-down resistor unit 40 may include a plurality of resistors and NMOS transistors serially connected to each other and connected to the output pad DQ. The bits of the pull-down calibration code ZQN<0:N−1> may be applied to respective ones of the NMOS transistors.

Figure 9:
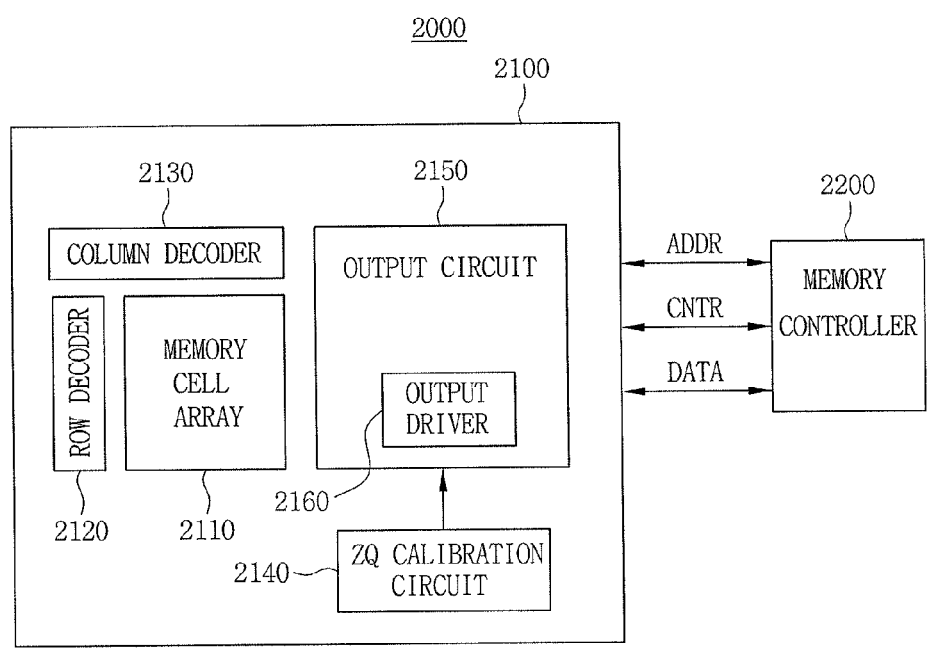
FIG. 9 illustrates an embodiment of a memory system including an ODT circuit.

FIG. 9 illustrates an embodiment of a memory system 2000 including an ODT circuit in accordance any of the aforementioned embodiments. Referring to FIG. 9, the memory system 2000 may include a semiconductor memory device 2100 and a memory controller 2200.

The memory controller 2200 generates an address signal ADDR and a control signal CNTR, and provides the address signal ADDR and the control signal CNTR to the semiconductor memory device 2100. Data may be transmitted from the memory controller 2200 to the semiconductor memory device 2100 through buses, or may be transmitted from the semiconductor memory device 2100 to the memory controller 2200 through the buses.

The semiconductor memory device 2100 may include a memory cell array 2110, a row decoder 2120, a column decoder 2130, a ZQ calibration circuit 2140, and an output circuit 2150. The output circuit 2150 may include an output driver 2160. The semiconductor memory device 2100 may include a pad to electrically connect the ZQ calibration circuit 2140 to the external resistor 18 of FIG. 2.

The offset codes of the ZQ calibration circuit 2140 may vary according to a result of ZQ calibration. Therefore, the offset codes of the ZQ calibration circuit 2140 may vary according to variations of one or more parameters that may produce distortion, interference, or other signal aberration. Examples of these parameters include, but are not limited to, fabrication process, operating voltage, and/or temperature.

The semiconductor memory device 2000 of FIG. 9 may include, for example, a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination thereof.

Figure 10:
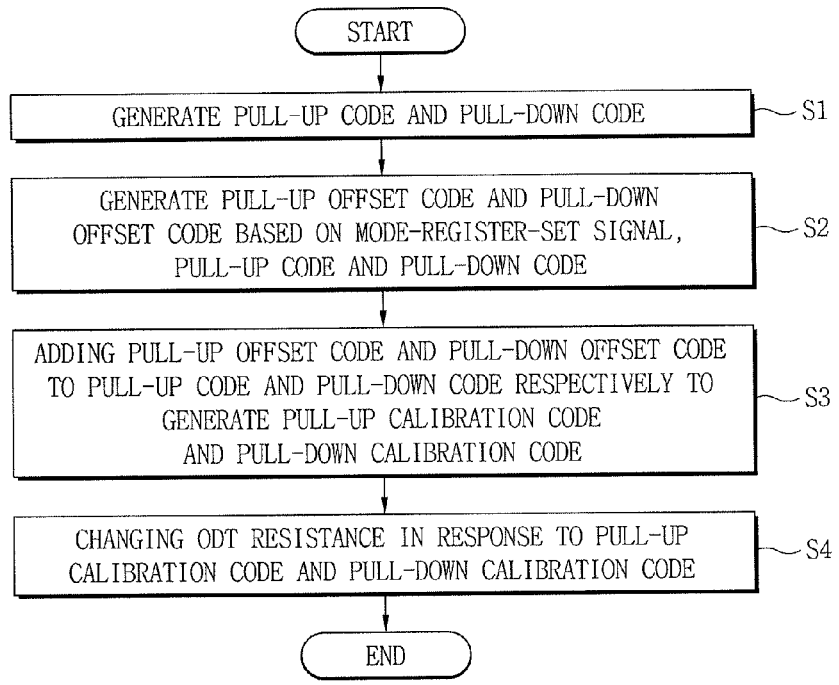
FIGS. 10 and 11 illustrate embodiments of methods of on-die termination (ODT)
Figure 11:
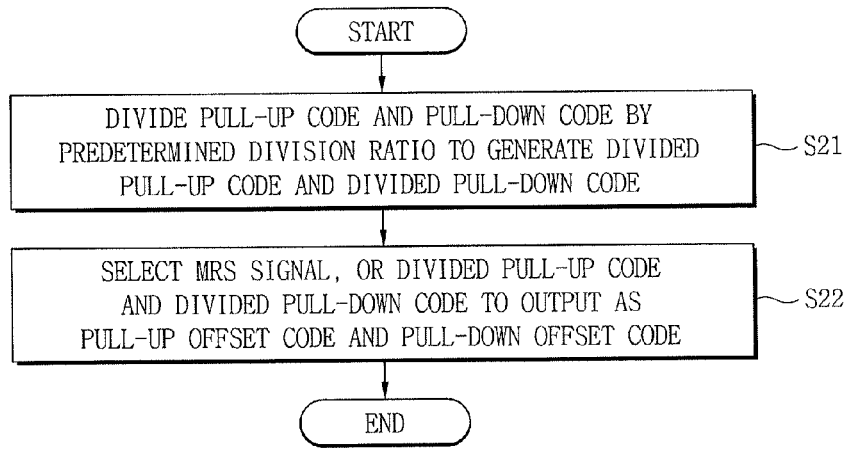

FIGS. 10 and 11 embodiments of methods of on-die termination (ODT).

Referring to FIG. 10, the method of on-die termination (ODT) may include the following operations:

(1) generating a pull-up code and a pull-down code (S1);

(2) generating a pull-up offset code and a pull-down offset code based on a mode-register-set signal, the pull-up code, and the pull-down code (S2);

(3) adding the pull-up offset code and the pull-down offset code to the pull-up code and the pull-down code, respectively, to generate a pull-up calibration code and a pull-down calibration code (S3); and (4) changing an ODT resistance in response to the pull-up calibration code and the pull-down calibration code (S4).

Referring to FIG. 11, generating the pull-up offset code and the pull-down offset code of the method of on-die termination (ODT) may include the following operations:

(1) dividing the pull-up code and the pull-down code by a predetermined division ratio to generate a divided pull-up code and a divided pull-down code (S21); and (2) selecting the MRS signal, or the divided pull-up code and the divided pull-down code to output as the pull-up offset code and the pull-down offset code (S22).

Figure 12:
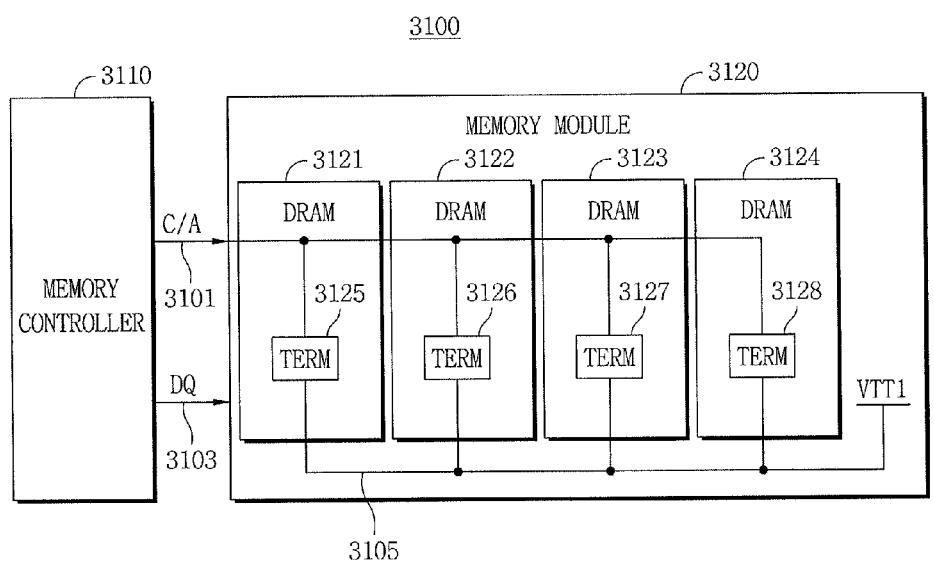
FIG. 12 illustrates another embodiment of a memory system.

FIG. 12 illustrates another embodiment of a memory system 3100 which includes a memory controller 3110 and a memory module 3120.

The memory controller 3110 generates a command/address signal C/A and a data signal DQ. The memory module 3120 operates in response to the command/address signal C/A and the data signal DQ. A plurality of semiconductor memory devices 3121, 3122, 3123, and 3124 are mounted on the memory module 3120. Each of the semiconductor memory devices 3121, 3122, 3123, and 3124 has a termination circuit 3125, 3126, 3127, or 3128 for a command/address bus 3101 through which the command/address signal C/A is transmitted. The command/address signal C/A may be a packet data in which a command signal and an address signal are combined in a packet form.

The memory module 3120 is shown to have four semiconductor memory devices in FIG. 12. In other embodiments, the memory module 3120 may have a different number of semiconductor memory devices, e.g. two or more semiconductor memory devices. Further, semiconductor memory devices may be mounted on both sides of a substrate of the memory module 3120.

The data signal DQ is transmitted or received between the memory controller 3110 and the semiconductor memory devices 3121, 3122, 3123, and 3124 comprising the memory module 3120 through a data bus 3103.

The command/address bus 3101 may have a fly-by structure which electrically connects the semiconductor memory devices 3121, 3122, 3123, and 3124 to each other. Further, the termination circuits 3125, 3126, 3127, and 3128 in respective ones of the semiconductor memory devices 3121, 3122, 3123, and 3124 are coupled between the command/address bus 3101 and a termination voltage VTT. The termination circuits 3125, 3126, 3127, and 3128 change a termination resistance of the command/address bus 3101.

Figure 13:
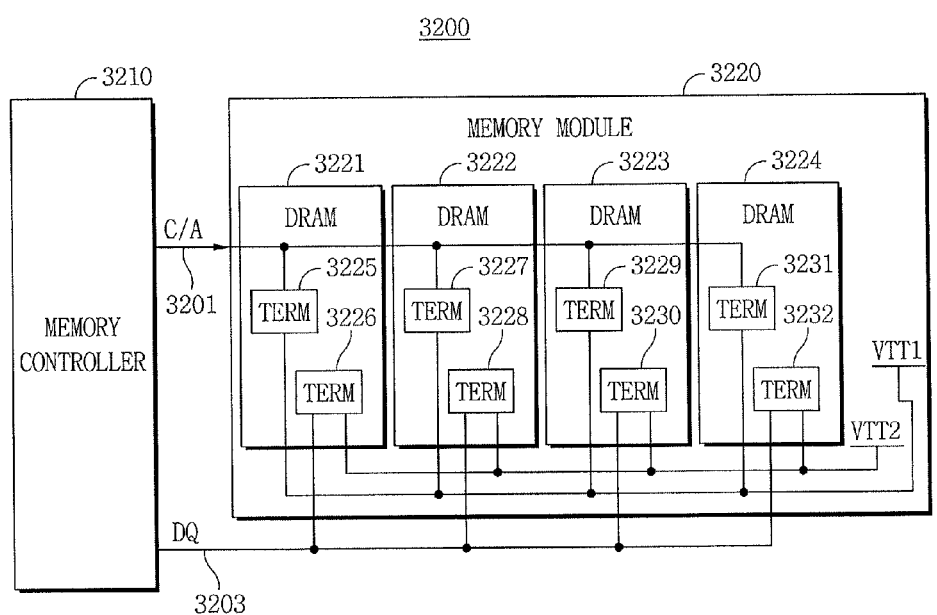
FIG. 13 illustrates another embodiment of a memory system.

FIG. 13 illustrates another embodiment of a memory system 3200 which includes a memory controller 3210 and a memory module 3220. The memory controller 3210 generates a command/address signal C/A and a data signal DQ. The memory module 3220 operates in response to the command/address signal C/A and the data signal DQ. A plurality of semiconductor memory devices 3221, 3222, 3223, and 3224 are mounted on the memory module 3220. The semiconductor memory devices 3221, 3222, 3223, and 3224 respectively include termination circuits 3225, 3227, 3229, and 3231 coupled to a command/address bus 3201, through which the command/address signal C/A is transmitted. The command/address signal C/A may be a packet data in which a command signal and an address signal are combined in a packet form. Further, the semiconductor memory devices 3221, 3222, 3223 and 3224 respectively include termination circuits 3226, 3228, 3230, and 3232 coupled to a data bus 3203, through which a data signal DQ is transmitted.

The memory module 3220 is shown to have four semiconductor memory devices in FIG. 13. In other embodiments, the memory module 3220 may have a different number of semiconductor memory devices, e.g., two or more semiconductor memory devices. Further, semiconductor memory devices may be mounted on both sides of a substrate of the memory module 3220.

The data signal DQ is transmitted or received between the memory controller 3210 and the semiconductor memory devices 3221, 3222, 3223, and 3224 comprising the memory module 3220 through data bus 3203.

The command/address bus 3201 has a fly-by structure, and electrically connects the semiconductor memory devices 3221, 3222, 3223, and 3224 to each other. Further, the termination circuits 3225, 3227, 3229, and 3231 in respective ones of the semiconductor memory devices 3221, 3222, 3223, and 3224 are coupled between the command/address bus 3201 and a first termination voltage VTT1. The termination circuits 3225, 3227, 3229, 3231 change a termination resistance of the command/address bus 3201. Further, the termination circuits 3226, 3228, 3230, and 3232 in respective ones of the semiconductor memory devices 3221, 3222, 3223, and 3224 are coupled between the data bus 3203 and a second termination voltage VTT2. The termination circuits 3226, 3228, 3230, and 3232 change a termination resistance of the data bus 3203.

The first termination voltage VTT1 is provided to each of the termination circuits 3225, 3227, 3229, and 3231. The second termination voltage VTT2 is provided to each of the termination circuits 3226, 3228, 3230, and 3232.

Figure 14:
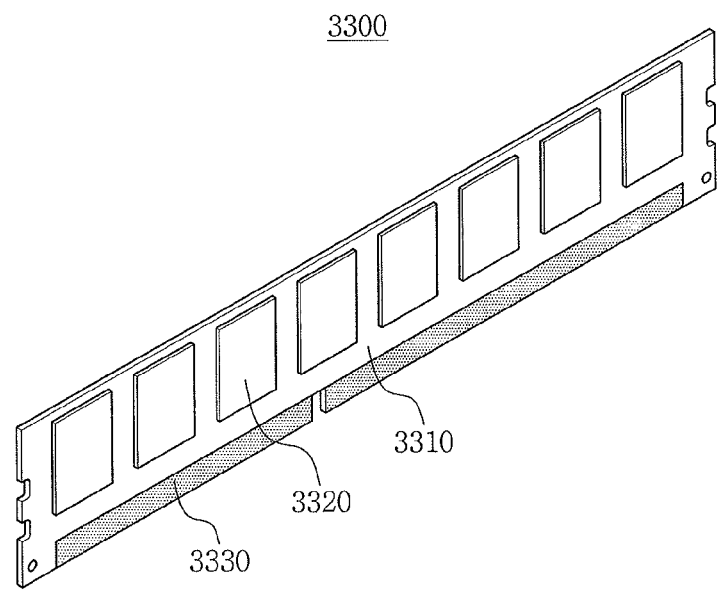
FIGS. 14 to 16 illustrate embodiments of memory modules.
Figure 15:
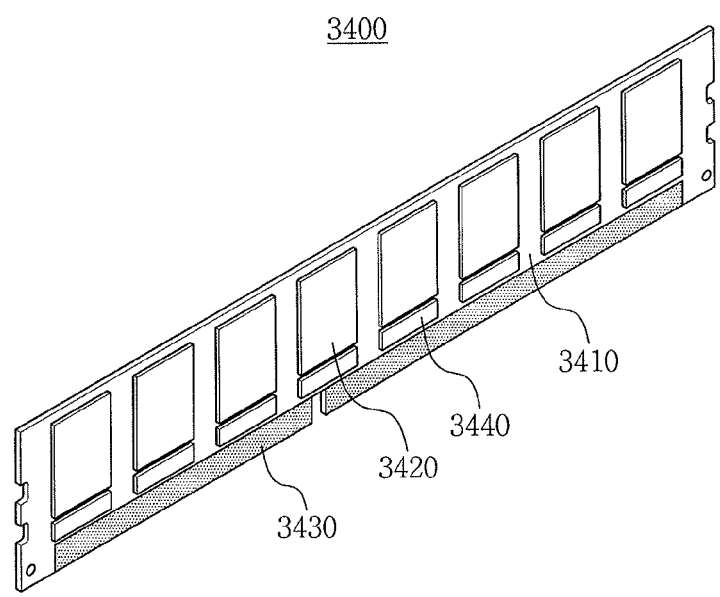
Figure 16:
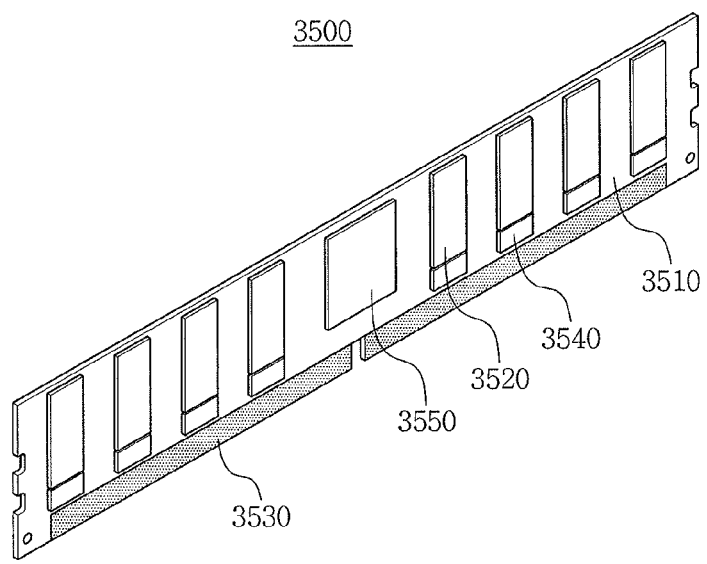

FIGS. 14 to 16 illustrate embodiments of memory modules 3300, 3400, and 3500, each of which includes one or more semiconductor memory devices. Referring to FIG. 14, the memory module 3300 may include a printed circuit board (PCB) 3310, a plurality of semiconductor memory devices 3320, and a connector 3330. The plurality of semiconductor memory devices 3320 may be mounted on one or both of top and bottom surfaces of the PCB 3310. The connector 3330 may be electrically connected to the plurality of semiconductor memory devices 3320 through conductive lines. Also, the connector 3330 may be connected to a slot of an external host.

Referring to FIG. 15, the memory module 3400 may include a PCB 3410, a plurality of semiconductor memory devices 3420, a connector 3430, and a plurality of buffers 3440. Each buffer 3440 may be disposed between a respective semiconductor memory device 3420 and connector 3430.

The semiconductor memory devices 3420 and the buffers 3440 may be provided on one or both of top and bottom surfaces of the PCB 3410. The semiconductor memory devices 3420 and the buffers 3440 formed on the top and bottom surfaces of the PCB 3410 may be connected through a plurality of via holes.

Referring to FIG. 16, the memory module 3500 may include a PCB 3510, a plurality of semiconductor memory devices 3520, a connector 3530, a plurality of buffers 3540, and a controller 3550.

The semiconductor memory devices 3520 and the buffers 3540 may be provided on one or both of top and bottom surfaces of the PCB 3510. The semiconductor memory devices 3520 and the buffers 3540 formed on the top and bottom surfaces of the PCB 3510 may be connected through a plurality of via holes.

Figure 17:
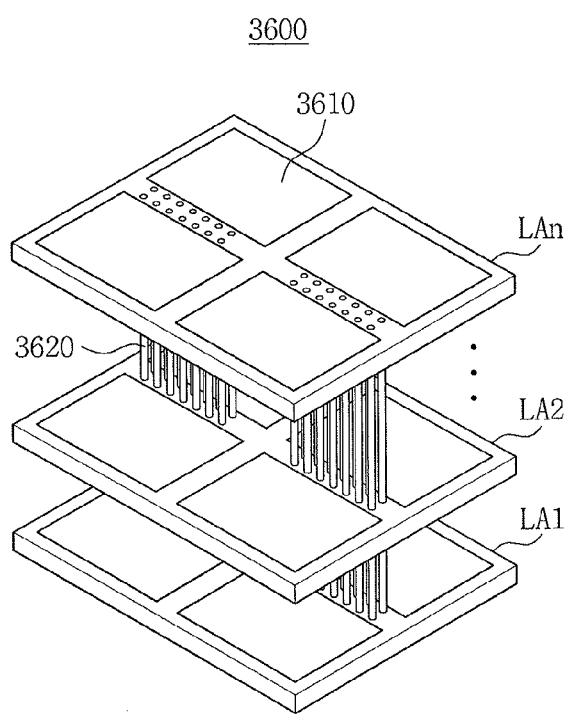
FIG. 17 illustrates an embodiment of a stacked semiconductor device.

FIG. 17 illustrates an embodiment of a stacked semiconductor device 3600 including one or more semiconductor memory devices. In the memory modules 3300, 3400, and 3500 of FIGS. 14 through 16, each of the semiconductor memory devices include a plurality of semiconductor layers LA1 to LAn.

In the stack semiconductor device 3600, the plurality of stacked semiconductor layers LA1 to LAn may be connected to one another through through-silicon vias (TSVs) 3620.

Figure 18:
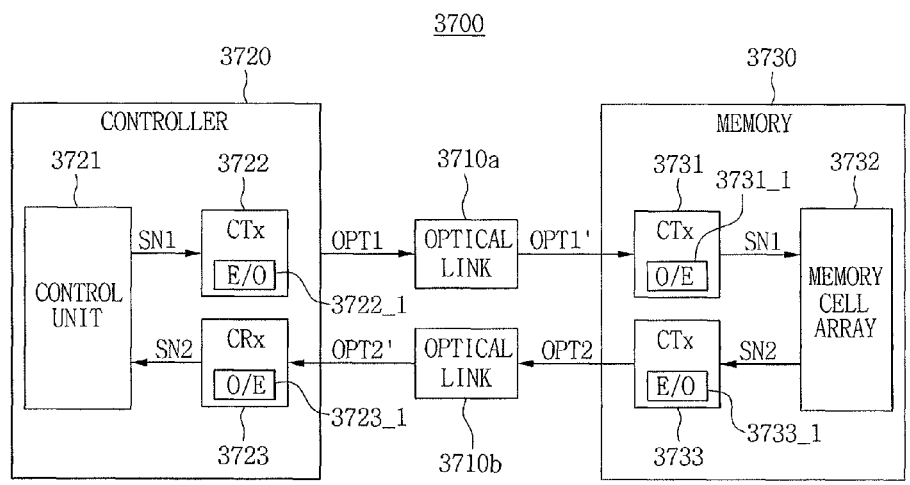
FIG. 18 illustrates an embodiment of a memory system including a semiconductor memory device and an optical link.

FIG. 18 illustrates an embodiment of a memory system 3700 including at least one semiconductor memory device and an optical link. Referring to FIG. 18, the memory system 3700 may include a controller 3720, a semiconductor memory device 3730, and a plurality of optical links 3710a and 3710b configured to interconnect the controller 3720 and the semiconductor memory device 3730. The controller 3720 may include a control unit 3721, a first transmitter 3722, and a first receiver 3723. The control unit 3721 may transmit a control signal SN1 to the first transmitter 3722.

The first transmitter 3722 may include a first optical modulator 3722_1, which may convert an electrical control signal SN1 into a first optical transmission signal OPT1 and which may transmit the first optical transmission signal OPT1 to the optical link 3710a.

The first receiver 3723 may include a first optical demodulator 3723_1, which may convert a second optical receiving signal OPT2', received from the optical link 3710b, into an electrical data signal SN2 and which may transmit the data signal SN2 to the control unit 3721.

The semiconductor memory device 3730 may include a second receiver 3731, a memory cell array 3732, and a second transmitter 3733. The second receiver 3731 may include a second optical modulator 3731_1, which converts a first optical receiving signal OPT1' received from the optical link 3710a into electrical control signal SN1 and which may transmit the control signal SN1 to the memory cell array 3732.

In the memory cell array 3732, data may be written under the control of the control signal SN1, or the data signal SN2 output from the memory cell array 3732 may be transmitted to the second transmitter 3733.

The second transmitter 3733 may include a second optical modulator 3733_1, which may convert electrical data signal SN2 into a second optical data signal OPT2 and which may transmit the second optical data signal OPT2 to the optical link 3710b.

Figure 19:
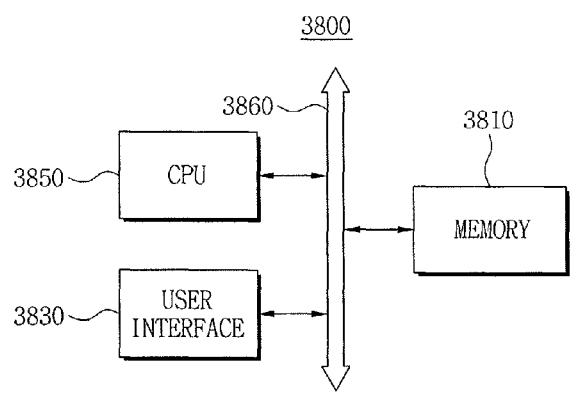
FIG. 19 illustrates an embodiment of a computer system including a semiconductor memory device.

FIG. 19 illustrates an embodiment of a computer system 3800 including at least one semiconductor memory device. Referring to FIG. 19, a semiconductor memory device may be mounted in a computer system 3800 such as a mobile apparatus or a desktop computer. The computer system 3800 may include a semiconductor memory device 3810, a CPU 3850, and a user interface 3830, which may be electrically connected to a system bus 3860.

By way of summation and review, one or more of the aforementioned embodiments provide an on-die termination circuit which changes offset codes for ZQ calibration, according to a result of ZQ calibration. One or more other embodiments provide a semiconductor memory device that includes the ODT circuit. One or more embodiments also provide a method of on-die termination (ODT) which changes offset codes for ZQ calibration, according to a result of ZQ calibration. The aforementioned embodiments may perform a precise and stable ZQ calibration, even when variations occur in a fabrication process, an operating voltage, and/or a temperature change.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An on-die termination (ODT) circuit, comprising:
   a calibration unit configured to generate a pull-up code and a pull-down code;
   an offset-code generating unit configured to generate a pull-up offset code and a pull-down offset code based on a mode-register-set (MRS) signal, the pull-up code, and the pull-down code;
   an adder configured to add the pull-up offset code and the pull-down offset code to the pull-up code and the pull-down code, respectively, and configured to generate a pull-up calibration code and a pull-down calibration code; and
   an ODT unit configured to change ODT resistance in response to the pull-up calibration code and the pull-down calibration code.

2. The ODT circuit as claimed in claim 1, wherein the pull-up offset code and the pull-down offset code are configured to vary according to a result of impedance (ZQ) calibration.

3. The ODT circuit as claimed in claim 1, wherein the pull-up offset code and the pull-down offset code are configured to vary according to a variation of one or more of a fabrication process, operating voltage, or temperature.

4. The ODT circuit as claimed in claim 1, wherein the ODT circuit is configured to compensate for impedance of a data bus in a memory system.

5. The ODT circuit as claimed in claim 1, wherein the ODT circuit is configured to compensate for an impedance of a command/address bus in a memory system.

6. The ODT circuit as claimed in claim 1, wherein the offset-code generating unit comprises:
   a divider configured to divide the pull-up code and the pull-down code by a predetermined division ratio and to generate a divided pull-up code and a divided pull-down code; and
   a selecting circuit configured to select the MRS signal, the divided pull-up code, and/or the divided pull-down code to output the pull-up offset code and the pull-down offset code.

7. The ODT circuit as claimed in claim 1, wherein the calibration unit comprises:
   a first pull-up resistor unit coupled to an impedance (ZQ) pad, and configured to be turned on in response to the pull-up code;
   a second pull-up resistor unit coupled to a first node, and configured to be turned on in response to the pull-up code;
   a pull-down resistor unit coupled to the first node, and configured to be turned on in response to the pull-down code;
   a first comparator configured to compare a reference voltage and a voltage of the ZQ pad;
   a second comparator configured to compare the reference voltage and a voltage of the first node;
   a pull-up counter configured to generate the pull-up code based on an output signal of the first comparator; and
   a pull-down counter configured to generate the pull-down code based on an output signal of the second comparator.

8. The ODT circuit as claimed in claim 1, wherein the ODT unit comprises:
   a pull-up resistor unit coupled to an output pad, and configured to operate in response to the pull-up calibration code; and
   a pull-down resistor unit coupled to the output pad, and configured to operate in response to the pull-down calibration code.

9. A semiconductor device, comprising:
an output pad; and
the ODT circuit of claim 1, the ODT circuit coupled to the output pad and configured to adjust an output impedance.

10. The semiconductor device as claimed in claim 9, wherein the ODT circuit is configured to change at least one of the pull-up offset code or the pull-down offset code according to a result of impedance (ZQ) calibration.

11. The semiconductor device as claimed in claim 9, wherein the pull-up offset code and the pull-down offset code is configured to adaptively vary according to variations of a fabrication process, operating voltage, and/or a temperature.

12. The semiconductor device as claimed in claim 9, wherein:
the semiconductor device is a stacked memory device, and
chips in the stacked memory device are coupled through-silicon-via (TSV), the chips communicating at least one of data or control signals.

13. A method of on-die termination (ODT), comprising:
generating a pull-up code and a pull-down code;
generating a pull-up offset code and a pull-down offset code based on a mode-register-set signal, the pull-up code, and the pull-down code;
adding the pull-up offset code and the pull-down offset code to the pull-up code and the pull-down code, respectively, to generate a pull-up calibration code and a pull-down calibration code; and
changing an ODT resistance in response to the pull-up calibration code and the pull-down calibration code.

14. The method as claimed in claim 13, wherein generating the pull-up offset code and the pull-down offset code comprises:
dividing the pull-up code and the pull-down code by a predetermined division ratio, to generate a divided pull-up code and a divided pull-down code; and
selecting the MRS signal, or the divided pull-up code and the divided pull-down code to output as the pull-up offset code and the pull-down offset code.

15. The method as claimed in claim 13, wherein the pull-up offset code and the pull-down offset code are configured to vary according to a result of impedance (ZQ) calibration.

16. A control device, comprising:
an impedance calibration unit configured to generate at least a first code;
an adder to add a second code configured to the first code to generate a third code; and
an on-die termination unit configured to adjust a resistance of a pad based on the third code.

17. The control device as claimed in claim 16, wherein the second code is generated based on the first code and a mode register set signal.

18. The control device as claimed in claim 16, wherein the on-die termination unit adjusts the resistance of the pad to substantially match a resistance of a circuit coupled to the pad.

19. The control device as claimed in claim 16, wherein:
the third code includes N bits, where N>1,
the N bits control a respective number of switches,
the switches are coupled to a respective number of resistors, and
the on-die termination unit adjusts the resistance of the pad based on a combination of resistors coupled to the switches having on-states controlled by ones of the N bits in the third code having a predetermined logical value.

20. The control device as claimed in claim 16, wherein the second code is an offset code.

* * * * *